United States Patent

Lee

[11] Patent Number: 5,881,113
[45] Date of Patent: Mar. 9, 1999

[54] REDUNDANCY CLOCK SUPPLY MODULE FOR EXCHANGE SYSTEM

[75] Inventor: Bum-Suk Lee, Seoul, Rep. of Korea

[73] Assignee: SamSung Electronics Co., Ltd., Kyungki-do, Rep. of Korea

[21] Appl. No.: 730,053

[22] Filed: Oct. 15, 1996

[30] Foreign Application Priority Data

Oct. 13, 1995 [KR] Rep. of Korea .................. 1995 35344

[51] Int. Cl.⁶ ....................................................... H04L 7/00
[52] U.S. Cl. .......................... 375/354; 375/356; 375/371; 327/142; 327/145; 327/151
[58] Field of Search ................................. 375/354–356, 375/362, 371, 373; 370/517; 326/93; 327/8, 12, 142, 145, 151, 153

[56] References Cited

U.S. PATENT DOCUMENTS

| | | | |
|---|---|---|---|
| 3,663,956 | 5/1972 | Purdy et al. | 324/76.82 |
| 3,967,250 | 6/1976 | Senda et al. | 395/182.01 |
| 4,748,644 | 5/1988 | Silver et al. | 375/376 |
| 5,022,057 | 6/1991 | Nishi et al. | 375/373 |
| 5,289,116 | 2/1994 | Kurita et al. | 324/76.11 |
| 5,371,416 | 12/1994 | Atriss et al. | 327/145 |
| 5,379,325 | 1/1995 | Katayama et al. | 375/354 |
| 5,442,315 | 8/1995 | Hutchins | 327/159 |
| 5,450,458 | 9/1995 | Price et al. | 375/356 |
| 5,459,764 | 10/1995 | Ohgami et al. | 375/354 |
| 5,502,297 | 3/1996 | Sherman | 235/472 |
| 5,537,655 | 7/1996 | Truong | 395/182.1 |
| 5,539,786 | 7/1996 | Snelgrove | 375/355 |
| 5,596,294 | 1/1997 | Kadomaru et al. | 327/145 |

*Primary Examiner*—Young T. Tse
*Attorney, Agent, or Firm*—Robert E. Bushnell, Esq.

[57] ABSTRACT

An exchange system comprising a plurality of redundant clock supply modules for receiving respective clock signals to maintain synchronization. Each redundant clock supply module includes a phase locked loop coupled to receive a network synchronizing reference signal, for generating a most significant clock of the exchange system synchronized to the network synchronizing reference signal; a clock generator for counting the most significant clock to generate a plurality of system clocks including a least significant clock and a first frame pulse; and a redundancy synchronizer for synchronizing the first frame pulse and a second frame pulse from a counterpart redundancy module to generate a redundancy synchronization signal for establishing synchronization between redundancy modules from the most significant clock to the least significant clock.

18 Claims, 5 Drawing Sheets

REDUNDANCY CLOCK SUPPLY MODULE FOR EXCHANGE SYSTEM

CROSS-REFERENCE TO RELATED APPLICATION

This application makes reference to, incorporates the same herein, and claims all benefits accruing under 35 U.S.C. §119 from an application for Clock Generating Circuit And Method For Exchange System earlier filed in the Korean Industrial Property Office on 13 Oct. 1995 and there duly assigned Ser. No. 35344/1995.

BACKGROUND OF THE INVENTION

1. Technical Field

The present invention relates to a clock generating circuit for an exchange system, and more particularly, relates to such a clock generating circuit and method for an exchange system capable of maintaining the constant timing in a range from a most significant clock to a least significant clock and redundancy synchronization.

2. Background Art

Generally, an exchange system improve reliability by using redundancy modules in a parallel fashion to insure that a particular task is carried through completion even when one of the modules becomes impaired. Such a redundant system is tolerant of faults as disclosed, for example, in U.S. Pat. No. 5,117,442 for Methods And Circuits For Synchronizing Signals In A Modular Redunaant Fault Tolerant Computer System issued to Hall, U.S. Pat. No. 5,377,205 for Fault Tolerant Clock With Synchronized Reset issued to Shi, U.S. Pat. No. 5,377,206 for Multiple-Channel Fault-Tolerant Clock System issued to Smith, and U.S. Pat. No. 5,537,655 for Synchronized Fault Tolerant Reset issued to Truong.

In such an exchange system employing redundancy modules, it is desirable that redundancy modules perform operations in synchronization with respect to other parallel modules. Conventional redundancy synchronization system which seeks to establish such synchronization typically requires synchronization of respective system clocks of high and low frequency bands between redundancy modules. While there are other clock synchronization systems known in the art as disclosed, for example, in U.S. Pat. No. 5,459,764 for Clock Synchronization System issued to Ohgami et al., it is my observation that none is available to synchronize clocks generated from redundancy modules with a constant timing in the range from a most significant clock to a least significant clock.

SUMMARY OF THE INVENTION

Accordingly, it is therefore an object of the present invention to provide an exchange system using redundancy clock supply modules.

It is also an object to provide an exchange system in which redundancy clock supply modules respectively establish mutual synchronization and maintain a constant timing between output clocks in the range from a most significant clock exhibiting a highest frequency to a least significant clock exhibiting a lowest frequency.

These and other objects of the present invention can be achieved by an exchange system comprising at least first and second redundancy clock supply modules. Each redundancy clock supply modules includes a phase locked loop for receiving a network synchronizing reference signal from an external source and generating a most significant clock exhibiting a highest frequency of the network synchronizing reference signal; a clock generator for counting the most significant clock, and simultaneously generating system clocks of different frequencies including a least significant clock exhibiting a lowest frequency and a frame pulse; and a redundancy synchronizer for synchronizing the frame pulse and another frame pulse of a counterpart redundancy clock supply module, delaying and NORing the two frame pulses, and generating a redundancy synchronization signal serving as an initializing signal of the clock generator of the counterpart redundancy clock supply module for maintaining redundancy synchronization between the redundancy clock supply modules from the most significant clock to the least significant clock.

The clock generator includes a first inverter for inverting the most significant clock exhibiting the highest frequency of 16 MHz, a first counter for counting an inverted most significant clock of 16 MHz so as to sequentially generate a first plurality of system clocks from 8 MHz to 2 MHz upon reset of a redundancy synchronization signal, a second inverter for inverting a first system clock of 2 MHz, a second counter for counting an inverted first system clock of 2 MHz so as to sequentially generate a second plurality of system clocks from 1 MHz to 128 KHz upon reset of the redundancy synchronization signal, a third counter for counting the inverted first system clock of 2 MHz so as to sequentially generate a third plurality of system clocks from 64 KHz to 8 KHz upon reset of the redundancy synchronization signal, a fourth counter for counting the inverted first system clock of 2 MHz so as to sequentially generate a fourth plurality of system clocks from 4 KHz to 512 Hz including a least significant clock exhibiting a lowest frequency of 512 Hz upon reset of the redundancy synchronization signal, a AND gate for logically combining the first system clock of 2 MHz and a frame period signal generated from the third counter so as to generate a first logic signal, and a flip-flop having a data terminal coupled to receive said first logic signal and a clock terminal coupled to receive a second system clock of 4 MHz so as to produce a frame pulse for generation of the redundancy synchronization signal serving as an initializing signal of the clock generator of the counterpart redundancy clock supply module.

The redundancy synchronizer includes a first AND gate for logically combining an inverted frame pulse and an inverted module activation signal, a second AND gate for logically combining an inverted frame pulse of the counterpart redundancy clock supply module and the module activation signal, a NOR gate for logically combining the outputs of said first and second AND gates to generate a first logic signal, a first delay flip-flop for delaying the first logic signal for a first period of the most significant clock of 16 MHz to produce a first delayed signal, a second delay flip-flop for delaying the first delayed for a second period of the most significant clock of 16 MHz to produce a second delayed signal, a third delay flip-flop for delaying the second logic signal for a third period of the most significant clock of 16 MHz to produce a third delayed signal, and a third AND gate for logically combining the third delayed signal and an inverted second delayed signal to produce the redundancy synchronization signal serving as an initializing signal of the clock generator of the counterpart redundancy clock supply module.

The present invention is more specifically described in the following paragraphs by reference to the drawings attached only by way of example.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
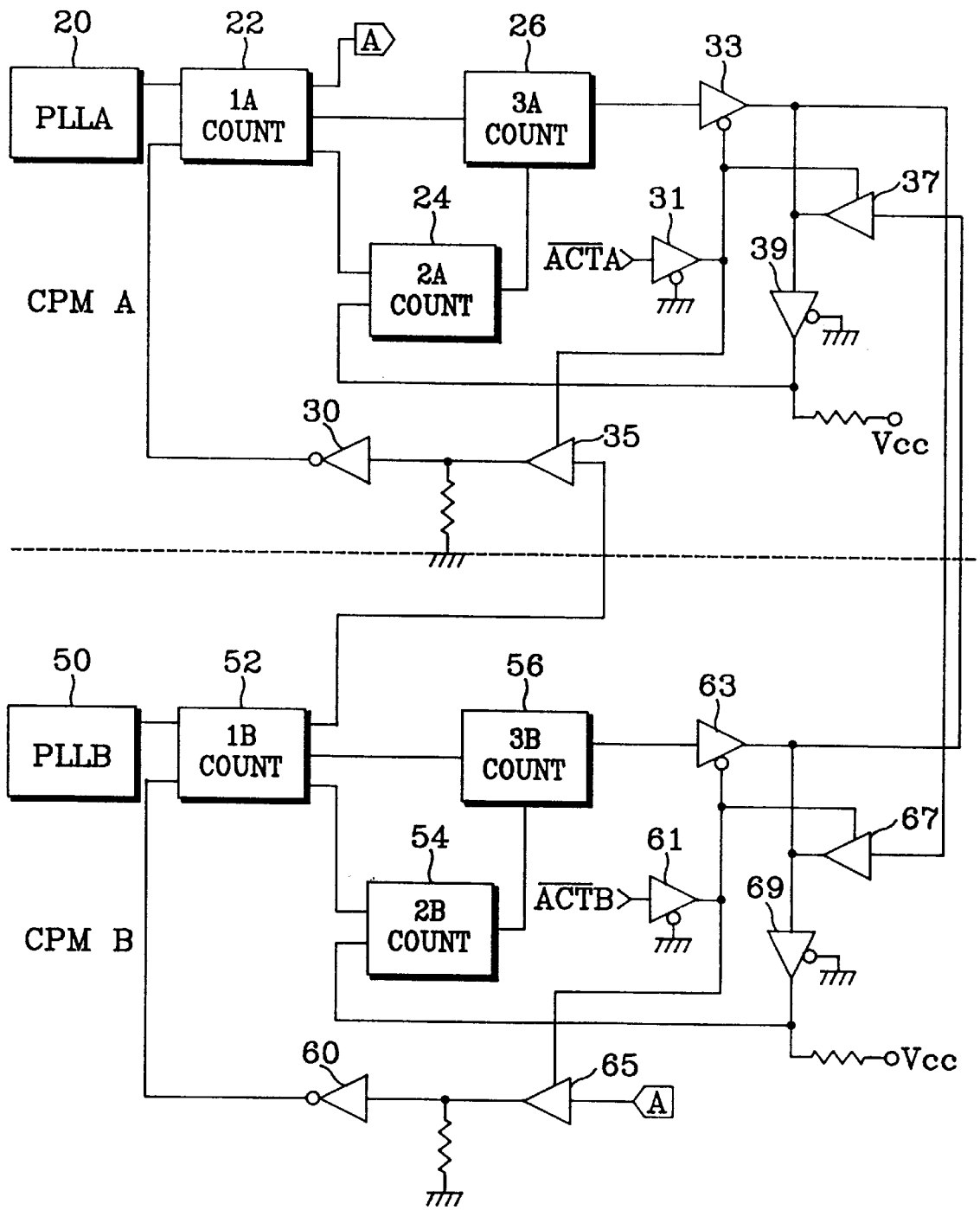
FIG. 1 illustrates an exchange system comprising a pair of typical clock supply redundancy modules.

Referring now to the drawings and particularly to FIG. 1, which illustrates an exchange system comprising a pair of typical clock redundancy modules CPM A and CPM B. First and second clock redundancy modules CMP A and CMP B include a first phase lock loops (PLLA) 20 and a second phase lock loop (PLLB) 52 connected to a network synchronizing reference signal to generate a respective clock signal for each redundancy modules so that a system clock of a high frequency band can be synchronized. A series of low frequency counters such as 1A COUNT 22, 1B COUNT 52, 2A COUNT 24, 2B COUNT 54, 3A COUNT 26, 3B COUNT 56 is connected between redundancy modules so that a system clock of a low frequency band can be synchronized by way of a series of interconnected inverters. Such redundancy synchronization system, however, is unable to synchronize respective system clocks generated from redundancy clock supply modules with a constant timing in the range from a most significant clock to a least significant clock.

Figure 2:
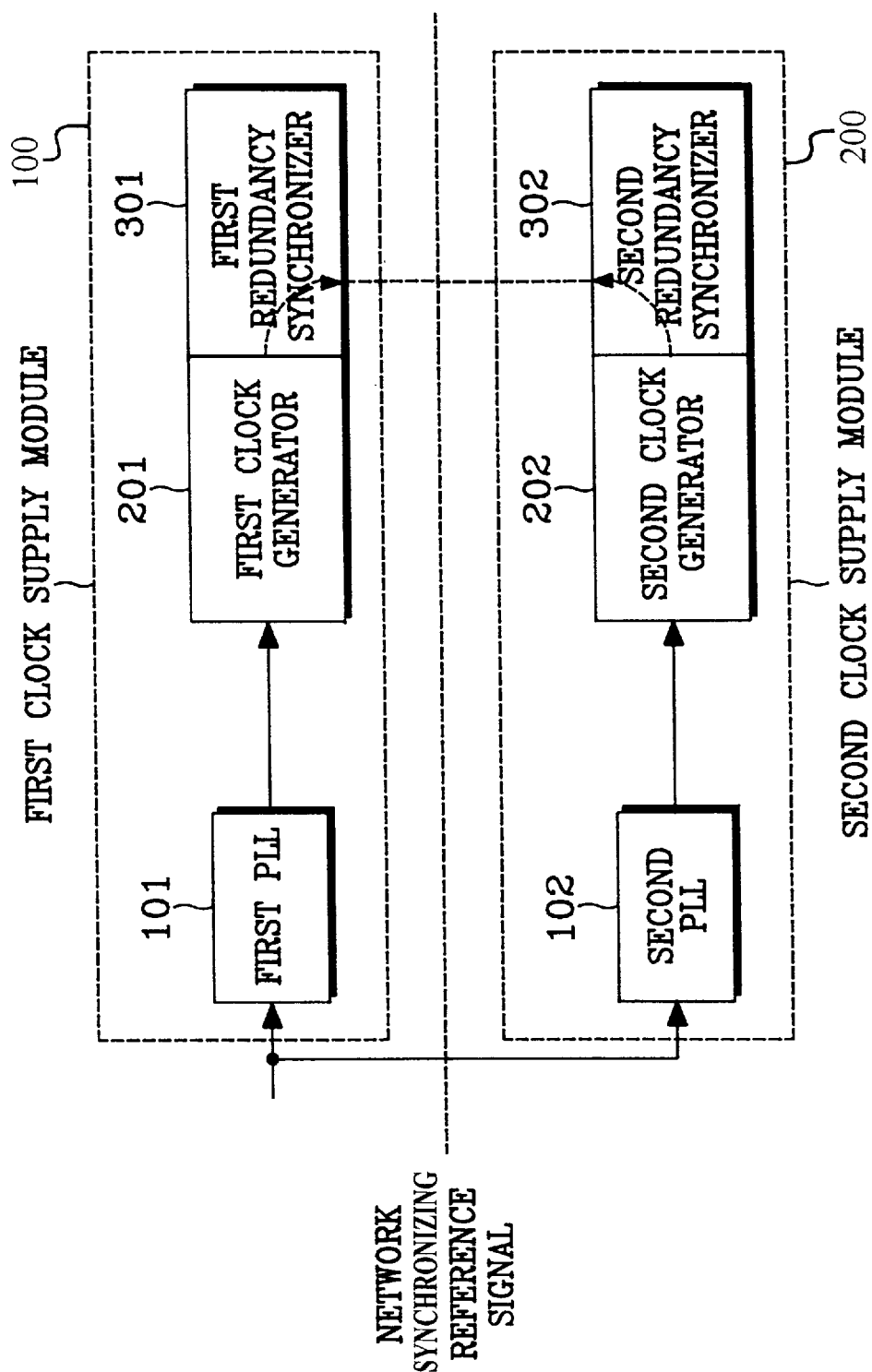
FIG. 2 illustrates an exchange system comprising a plurality of clock supply redundancy modules constructed according to the principles of the present invention.

Turning now to FIG. 2 which illustrates an exchange system comprising a first and a second redundancy clock supply modules 100 and 200 constructed according to the principles of the present invention. The redundancy clock supply modules seek to respectively establish mutual synchronization and maintain a constant timing between system clocks in the range from a most significant clock to a least significant clock.

As shown in FIG. 2, a first redundancy clock supply module 100 includes a first phase locked loop PLL 101 coupled to receive a network synchronizing reference signal from an external source for generating a most significant clock of the exchange system synchronized to the network synchronizing reference signal. A first clock generator 201 is connected to the first PLL 101 to count the most significant clock and then generate a least significant clock. A first redundancy synchronizer 301 is connected to the first clock generator 201 to receive a frame pulse /fp of the first clock generator 201 and another frame pulse /fp of a counterpart or second redundancy clock supply module, and then to generate a redundancy synchronization signal /cclr. The redundancy synchronization signal /cclr is supplied as an initializing signal of the first clock generator 201.

A second redundancy clock supply module 200 includes a second phase locked loop PLL 102 coupled to receive the same network synchronizing reference signal for generating a most significant clock of the exchange system synchronized to the network synchronizing reference signal. A second clock generator 202 is connected to the second PLL 102 to count the most significant clock and then to generate a least significant clock. A second redundancy synchronizer 302 is connected to the second clock generator 202 to receive a frame pulse /fp of the second clock generator 202 and another frame pulse /fp of the counterpart or first redundancy clock supply module for generating a redundancy synchronization signal /cclr. The redundancy synchronization signal /cclr is supplied as an initializing signal of the second clock generator 202.

As a result, the first and second redundancy clock supply modules 100 and 200 of an exchange system respectively serve as an operating clock supply module and a standby clock supply module. In such an exchange system, each clock supply module includes a phase locked loop (PLL) for supplying the exchange system with a timing synchronized to the network synchronizing reference signal received from an external source. The respective clock generators 201 and 202 then include counters for counting a most significant clock such as 16 MHz generated from the PLLs 101 and 102 to sequentially generate system clocks in the range from the most significant clock to a least significant clock such as 512 Hz for use in the exchange system. The redundancy synchronizers 301 and 302 generate redundancy synchronization signals for the respective operating and standby clock supply modules in order to maintain synchronization of the system clocks upon redundancy switching.

Figure 3:
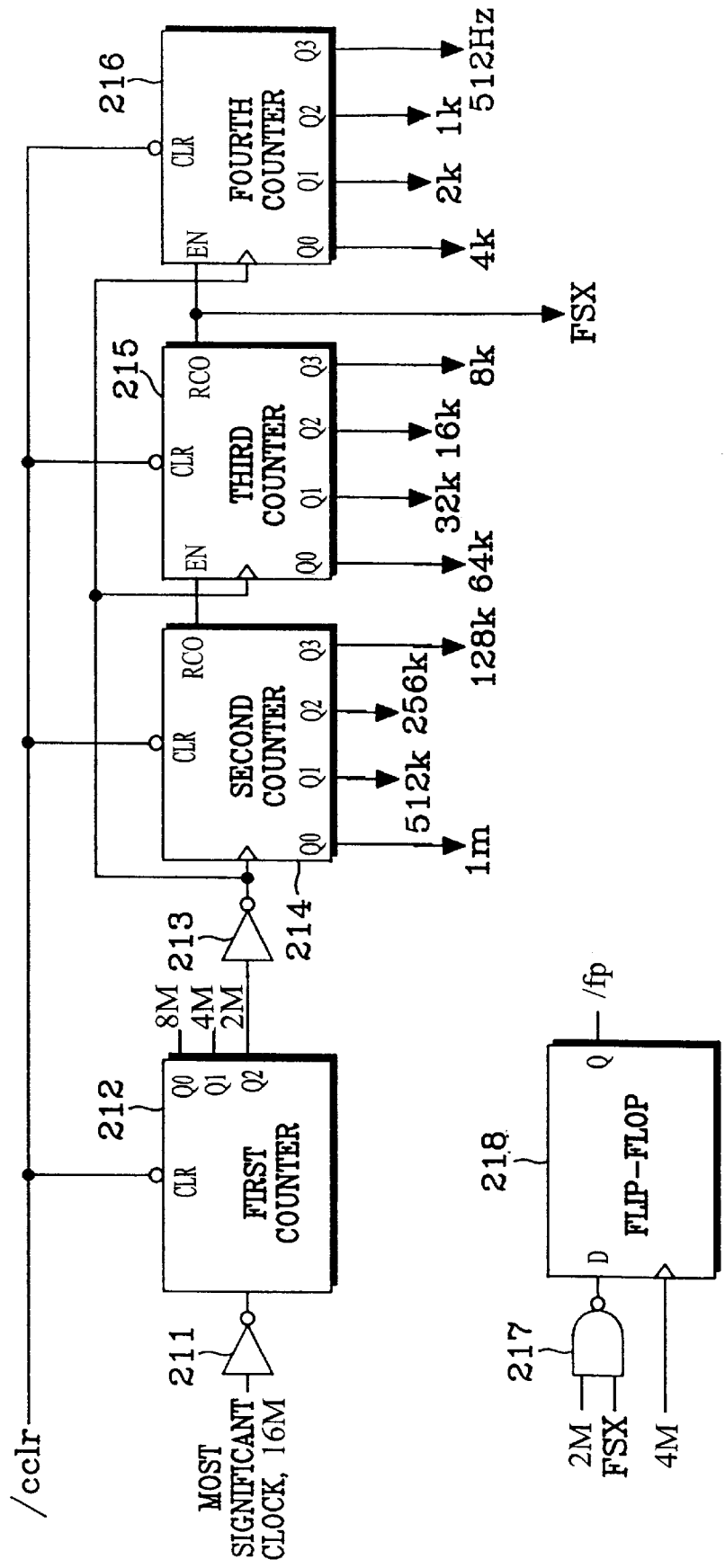
FIG. 3 is a detailed circuit diagram illustrating a clock generator of each clock supply redundancy module constructed according to the principles of the present invention.

FIG. 3 is a detailed circuit diagram illustrating each of first and second clock generators 201 and 202 as shown in FIG. 2. For example, the first clock generator 201 includes a first inverter 211 for inverting the most significant clock of 16 MHz and a first counter 212 for counting an inverted clock of 16 MHz to generate a 8 MHz, 4 MHz and 2 MHz system clocks upon reset of a redundancy synchronization signal serving as a clear signal /cclr. A second inverter 213 is connected to the first counter 212 to invert a system clock of 2 MHz. A second counter 214 has an input terminal coupled to receive an inverted clock of 2 MHz for counting the inverted clock of 2 MHz to sequentially generate a 1 MHz, 512 KHz, 256 KHz and 128 KHz system clocks upon reset of the clear signal /cclr. A third counter 215 has an input terminal coupled to receive an inverted clock of 2 MHz for counting the inverted clock of 2 MHz to generate a 64 KHz, 32 KHz, 16 KHz and 8 KHz system clocks upon reset of the redundancy synchronization signal serving as a clear signal /cclr when a first enable signal is received from the second counter 214 via an enable terminal EN. The third counter 215 also generates a second enable signal RCO corresponding to a 8 KHz system clock in a form of a frame period signal FSX. A fourth counter 216 has an input terminal coupled to receive an inverted clock of 2 MHz for counting the inverted clock of 2 MHz to generate a 4 KHz, 2 KHz, 1 KHz and 512 Hz system clocks upon reset of the redundancy synchronization signal serving as a clear signal /cclr when a second enable signal is received from the third counter 215 via an enable terminal EN. A system clock of 512 Hz as generated by the fourth counter 216 serves as a least significant clock for redundancy clock supply modules to maintain synchronization.

The frame period signal FSX generated from the third counter 215 is then supplied to a NAND gate 217 for a NAND operation with a system clock of 2 MHz. A flip-flop 218 then receives the output of the NAND gate 217 as data and a system clock of 4 MHZ to generate a first frame pulse /fp.

Figure 4:
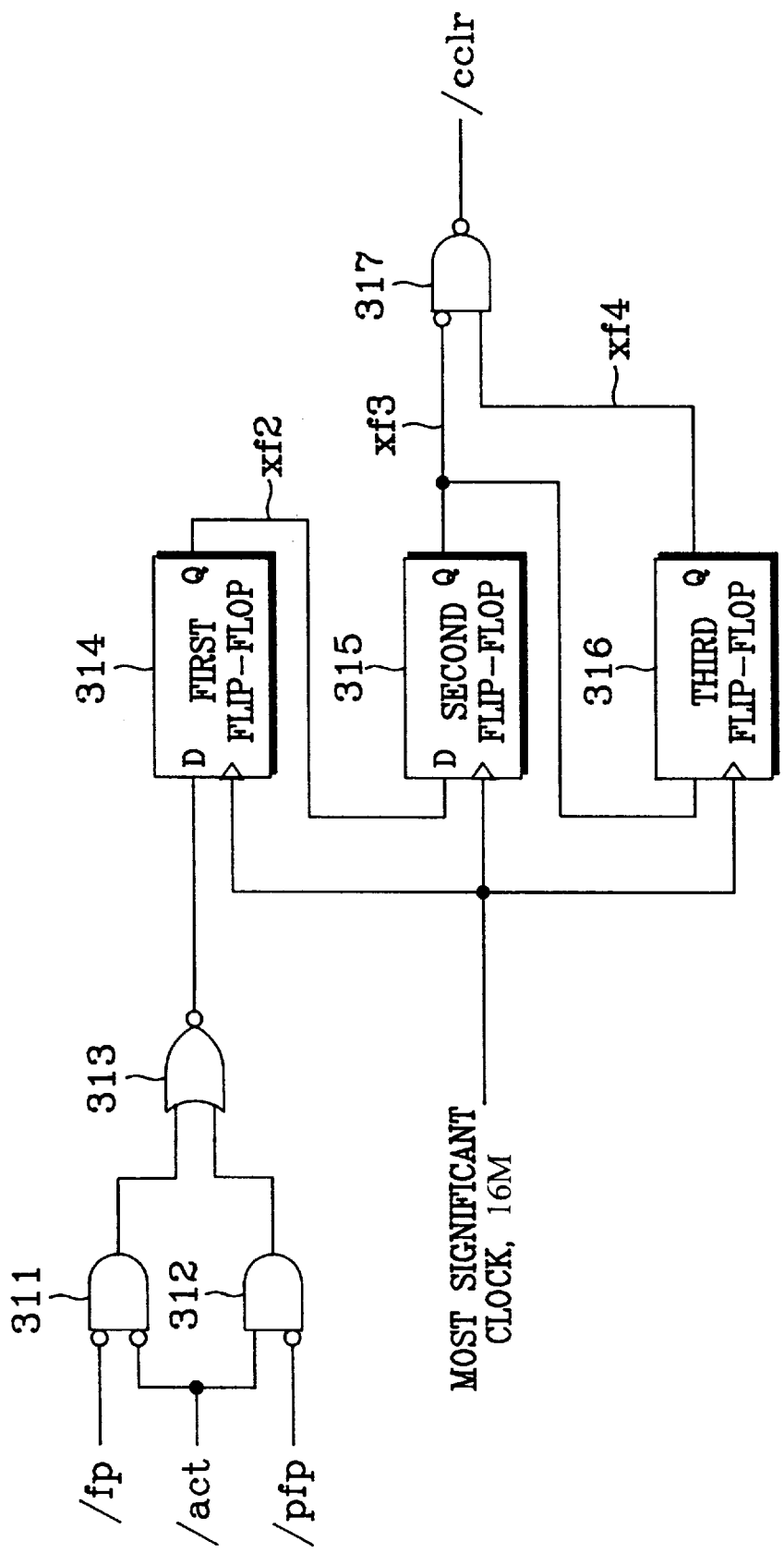
FIG. 4 is a detailed circuit diagram illustrating a redundancy synchronizer of each clock supply redundancy module constructed according to the principles of the present invention.

FIG. 4 is a detailed circuit diagram illustrating each of first and second redundancy synchronizers 301 and 302 as shown in FIG. 2. The first redundancy synchronizer 301, for example, includes a first AND gate 311 having a first and second inverted terminals coupled to receive the first frame pulse /fp and a module activation signal /act for generating a first AND logic signal. A second AND gate 312 has an inverted terminal coupled to receive a second frame pulse /pfp from the counterpart or second redundancy clock supply module and a non-inverted terminal coupled to receive a module activation signal /act for generating a second AND logic signal. A NOR gate 313 NORs the first and second AND logic signals to generate a NOR logic signal. A first flip-flop 314 receives the NOR logic signal as data and the most significant clock of 16 MHz to generate a first flip-flop signal. A second flip-flop 315 receives the first flip-flop signal as data and the same most significant clock of 16 MHz. A third flip-flop 316 receives the second flip-flop signal as data and the same most significant clock of 16 MHz. A third NAND gate 317 NANDs inverted output of the second flip-flop 315 and the non-inverted output of the third flip-flop 316 to generate a NANDed output as a redundancy synchronization signal serving as a clear signal /cclr for the first and second clock generators 201 and 202.

Figure 5:
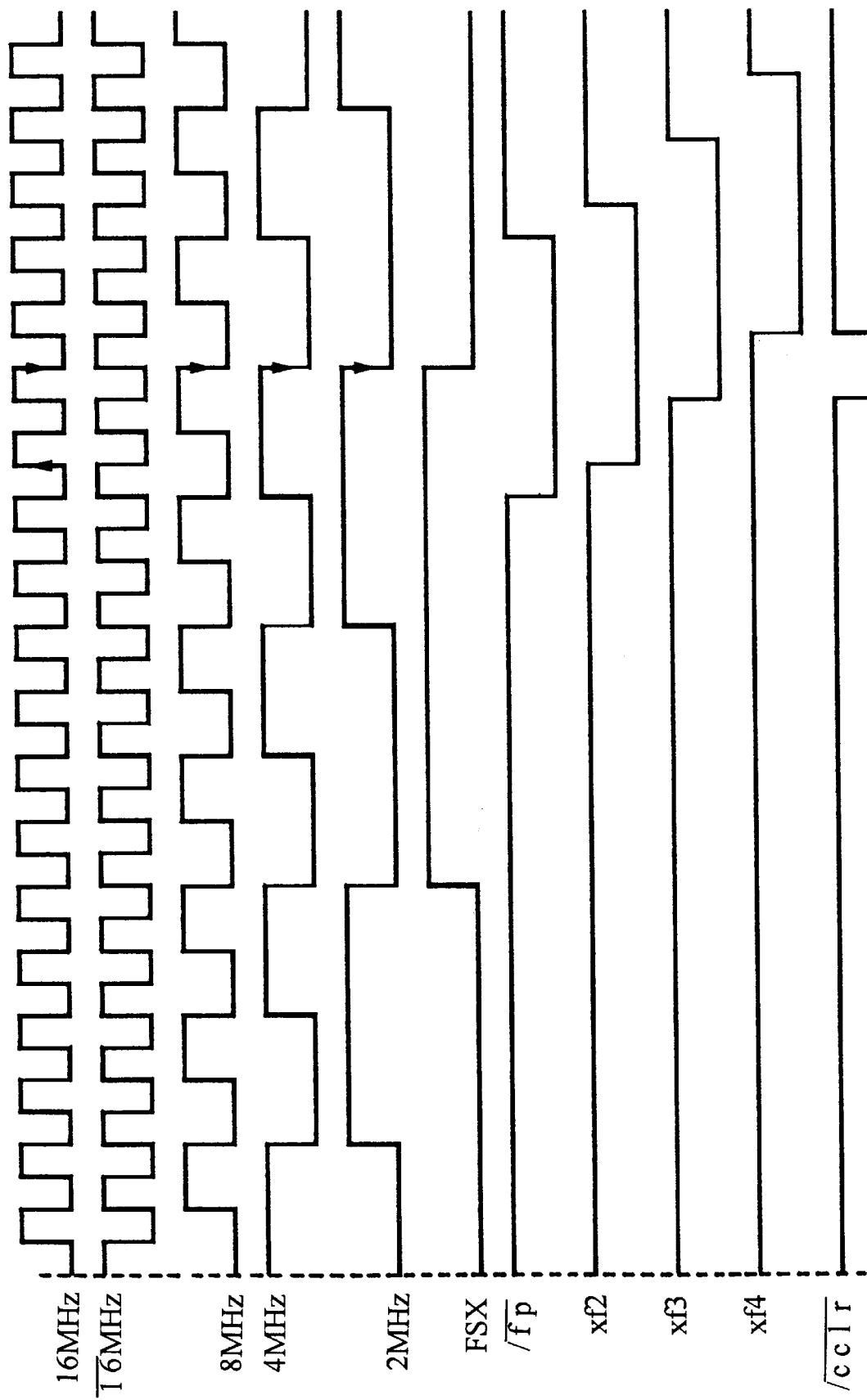
FIG. 5 is a timing diagram illustrating operation of each clock supply redundancy module constructed according to the present invention.

FIG. 5 is a timing diagram illustrating operation of each of the redundancy clock supply modules constructed according to the principles of the present invention. A process of establishing clock synchronization between the first and second redundancy clock supply modules 100 and 200 as contemplated by the present invention will now be described with reference to FIGS. 2 to 5.

First, the first counter 212 counts the most significant clock of 16 MHz as shown in FIG. 5 to a 8 MHz, 4 MHz and 2 MHz system clocks. The second to fourth counters 214, 215 and 216 counts the system clock of 2 MHz of the first counter 212 to generate a series of system clocks from a range of 1 MHz to 512 Hz. In addition, the second counter 215 also generates a frame period signal FSX of 8 KHz. Each clear terminal of the first to fourth counters 212 to 216 is connected to the redundancy synchronization signal /cclr so as to be periodically initialized. Accordingly, each first and second clock generator 201 and 202 counts the system clock of 16 MHz as the most significant clock of the exchange system and sequentially generates system clocks to a 512 Hz clock serving as a least significant clock of the exchange system.

Likewise, each of the first and second clock generators 201 and 202 generates a frame pulse /fp for generation of the redundancy synchronization signal /cclr. The NAND gate 217 then logically combines a system clock of 2 MHz and a frame period signal FSX. The flip-flop 218 receives the output of the NAND gate 217 as data, synchronizes the output of the NAND gate 217 with a system clock of 4 MHz and outputs a synchronized output as the frame pulse /fp as shown in FIG. 5.

When the first and second redundancy clock supply modules 100 and 200 serve as operating and standby modules, the clock supply module of a standby mode generates a redundancy synchronization signal /cclr by using an operating module frame pulse /pfp and a frame pulse /fp from the clock supply module of an operating mode. In other words, by operation of the module activation signal /act, the AND gates 311, 312 and the NOR gate 312, respectively generate a frame pulse /fp upon activation of the operating clock supply module and a frame pulse /pfp upon activation of the standby clock supply module, so that the output frame pulse can be transmitted to the first flip-flop 314.

Since the first to third flip-flops 314 to 316 respectively synchronize the output of the NOR gate 313 with a system clock of 16 MHz, the first to third flip-flops 314 to 316 respectively generate a first, second and third flip-flop signals xf2, xf3 and xf4 as shown in FIG. 5. The NAND gate 317 NANDs the third flip-flop signal xf4 and an inverted signal of the second flip-flop signal xf3 to generate a redundancy synchronization signal /cclr.

The redundancy synchronization signal /cclr is generated at a falling edge of system clocks of 16 MHz, 8 MHz, 4 MHz and 2 MHz and a frame period signal FSX when the frame pulse /fp is at a low logic level as shown in FIG. 5. The redundancy synchronization signal /cclr is enabled when each redundancy clock supply module generates the frame pulse /fp. Thus, when the system clock of the two redundancy clock supply modules is synchronized, the redundancy synchronization signal /cclr is generated. The redundancy synchronization signal /cclr generated as described is applied to clear terminals of respective counters 212 to 216 of the first and second clock generators 201 and 202.

Then, the counters 212 to 216 of the first and second clock generators 201 and 202 in each system clock are concurrently initialized by the redundancy synchronization signal /cclr. Therefore, the present invention controls the clock generators of the redundancy clock supply modules so as to synchronize the redundancy module by transmitting/receiving a single signal and to maintain the constant timing in a range from the most significant clock to the least significant clock.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the appended claims. In the claims, means-plus-function clause are intended to cover the structures described herein as performing the recited function and not only structural equivalents but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. An exchange system comprising a plurality of redundant clock supply modules for receiving respective clock signals, each redundant clock supply module comprising:

a phase locked loop coupled to receive a network synchronizing reference signal, for generating a most significant clock signal of said exchange system synchronized to said network synchronizing reference signal;

a clock generator for counting said most significant clock signal to generate a plurality of system clock signals including a least significant clock signal and a first frame pulse; and a redundancy synchronizer for synchronizing said first frame pulse and a second frame pulse from a counterpart redundant clock supply module to generate a redundancy synchronization signal for establishing clock synchronization between redundant clock supply modules from said most significant clock signal to said least significant clock signal.

2. The exchange system of claim 1, further comprised of said clock generator comprising:

counter means for counting said most significant clock signal exhibiting a highest frequency of 16 MHz and generating said plurality of system clock signals of different frequencies in the range of 1 MHz to said least significant clock signal exhibiting a lowest frequency of 512 Hz; and frame pulse generator means for generating said first frame pulse in dependence upon reception of said system clock signals and a frame period signal.

3. The exchange system of claim 2, further comprised of said frame pulse generator means comprising:

a NAND gate for logically combining a first system clock signal exhibiting a frequency of 2 MHz and said frame period signal exhibiting a frequency of 8 MHz to generate a first logic signal; and latch means for synchronizing the first logic signal to a second system clock exhibiting a frequency of 4 MHz and generating a synchronized output as said first frame pulse.

4. The exchange system of claim 1, further comprised of said clock generator comprising:

a first inverter for inverting the most significant clock signal;

a first counter for counting the inverted most significant clock signal to sequentially generate a first plurality of system clock signals upon reset of said redundancy synchronization signal;

a second inverter for inverting a first system clock signal from said first plurality of system clock signals;

a second counter for counting the inverted first system clock signal to sequentially generate a second plurality of system clock signals upon reset of said redundancy synchronization signal;

a third counter for counting said inverted first system clock signal to sequentially generate a third plurality of system clock signals upon reset of said redundancy synchronization signal;

a fourth counter for counting said inverted first system clock signal to sequentially generate a fourth plurality of system clock signals including said least significant clock signal upon reset of said redundancy synchronization signal;

a NAND gate for logically combinining said first system clock signal and a frame period signal generated from said third counter to generate a first logic signal; and a flip-flop having a data terminal coupled to receive said first logic signal and a clock terminal coupled to receive a second system clock from said first plurality of system clock signals to produce said first frame pulse for generation of said redundancy synchronization signal.

5. The exchange system of claim 4, further comprised of said redundancy synchronizer comprising:

frame pulse selector means coupled to receive said first frame pulse and a second frame pulse of the counterpart redundancy clock supply module, for generating a first logic signal upon activation of a module activation signal, said first logic signal corresponding to one of the frame pulses of an active redundancy clock supply module and counterpart redundancy clock supply module; and redundancy synchronization signal generator means for synchronizing said first logic signal is to said most significant clock signal and generating said redundancy synchronization signal.

6. The exchange system of claim 5, further comprised of said frame pulse selector means comprising:

a first gate for ANDing inverted signals of said first frame pulse and said module activation signal;

a second gate for ANDing an inverted signal of said second frame pulse of the counterpart redundancy clock supply module and said module activation signal; and a third gate for NORing the outputs of said first and second gates to generate said first logic signal.

7. The exchange system of claim 6, further comprised of said redundancy synchronization signal generator means comprising:

a first delay flip-flop for delaying said first logic signal for a first period of said most significant clock signal to produce a first delayed signal;

a second delay flip-flop for delaying said first delayed signal for a second period of said most significant clock signal to produce a second delayed signal;

a third delay flip-flop for delaying said second delayed signal for a third period of said most significant clock signal to produce a third delayed signal; and a gate for NANDing said third delayed signal and an inverted second delayed signal to produce said redundancy synchronization signal.

8. The exchange system of claim 1, further comprised of said clock generator comprising:

a first inverter for inverting the most significant clock signal exhibiting a highest frequency of 16 MHz;

a first counter for counting the inverted most significant clock signal exhibiting the highest frequency of 16 MHz so as to sequentially generate a first plurality of system clock signals exhibiting different frequencies from 8 MHz to 2 MHz upon reset of said redundancy synchronization signal;

a second inverter for inverting a first system clock signal exhibiting a frequency of 2 MHz;

a second counter for counting the inverted first system clock signal exhibiting the frequency of 2 MHz so as to sequentially generate a second plurality of system clock signals exhibiting different frequencies from 1 MHz to 128 KHz upon reset of said redundancy synchronization signal;

a third counter for counting the inverted first system clock signal exhibiting the frequency of 2 MHz so as to sequentially generate a third plurality of system clock signals exhibiting different frequencies from 64 KHz to 8 KHz upon reset of said redundancy synchronization signal;

a fourth counter for counting the inverted first system clock signal exhibiting the frequency of 2 MHz so as to sequentially generate a fourth plurality of system clock signals exhibiting different frequencies from 4 KHz to 512 Hz including said least significant clock signal exhibiting a lowest frequency of 512 Hz upon reset of said redundancy synchronization signal;

a first NAND gate for logically combining the first system clock exhibiting the frequency of 2 MHz and a frame period signal generated from the third counter so as to generate a first logic signal; and a flip-flop having a data terminal coupled to receive said first logic signal and a clock terminal coupled to receive a second system clock exhibiting a frequency of 4 MHz so as to produce said first frame pulse for generation of the redundancy synchronization signal serving as an initializing signal of the clock generator of the counterpart redundancy clock supply module.

9. The exchange system of claim 8, further comprised of said redundancy synchronizer comprising:

a first AND gate for logically combining an inverted first frame pulse and an inverted module activation signal;

a second AND gate for logically combining an inverted second frame pulse of the counterpart redundancy clock supply module and the module activation signal;

a NOR gate for logically combining the outputs of said first and second AND gates to generate a logic signal;

a first delay flip-flop for delaying the logic signal for a first period of the most significant clock signal exhibiting the highest frequency of 16 MHz to produce a first delayed signal;

a second delay flip-flop for delaying the first delayed signal for a second period of the most significant clock signal to produce a second delayed signal;

a third delay flip-flop for delaying the second delayed signal for a third period of the most significant clock signal to produce a third delayed signal; and a NAND gate for logically combining the third delayed signal and the inverted second delayed signal to produce the redundancy synchronization signal serving the an initializing signal of the clock generator of the counterpart redundancy clock supply module.

10. An exchange system comprising an active redundant clock supply module and a standby redundant clock supply module, each module comprising:

a clock generator for counting a most significant clock signal exhibiting a highest frequency and generating a plurality of system clock signals exhibiting different frequencies extending from the most significant clock signal to a least significant clock signal exhibiting a lowest frequency, and a frame period signal upon reset of a redundancy synchronization signal;

a frame pulse generator for generating a first frame pulse upon reception of first selected system clock signals and said frame period signal;

a frame pulse selector for generating a selected frame pulse upon selective transmission of one of said first frame pulse of the active redundant clock supply module and a second frame pulse of the standby redundant clock supply module in dependence upon a module activation signal; and a redundancy synchronization generator for synchronizing said selected frame pulse to said most significant clock signal to generate said redundancy synchronization signal serving as an initialization signal for respective clock generator to maintain clock synchronization between the active redundant clock supply module and the standby redundant clock supply module from the most significant clock signal to the least significant clock signal.

11. The exchange system of claim 10, further comprised of said clock generator comprising:

a first inverter for inverting each pulse of the most significant clock signal exhibiting a highest frequency of 16 MHz;

a first counter for counting the inverted most significant clock signal to sequentially generate a first plurality of system clock signals exhibiting different frequencies from 8 MHz to 2 MHz upon reset of said redundancy synchronization signal;

a second inverter for inverting a first system clock signal exhibiting a frequency of 2 MHz;

a second counter for counting the inverted first system clock signal exhibiting the frequency of 2 MHz to sequentially generate a second plurality of system clock signals exhibiting different frequencies from 1 MHz to 128 KHz upon reset of said redundancy synchronization signal;

a third counter for counting said inverted first system clock signal to sequentially generate said frame period signal and a third plurality of system clock signals exhibiting different frequencies from 64 KHz to 8 KHz upon reset of said redundancy synchronization signal; and a fourth counter for counting said inverted first system clock signal to sequentially generate a fourth plurality of system clock signals from 4 KHz to the least significant clock signal exhibiting a lowest frequency of 512 Hz upon reset of said redundancy synchronization signal.

12. The exchange system of claim 11, further comprised of said frame pulse generator comprising:

a first NAND gate for logically combining said first system clock signal exhibiting the frequency of 2 MHz and said frame period signal to generate a first logic signal; and a first delay flip-flop having a data terminal coupled to receive said first logic signal and a clock terminal coupled to receive a second system clock signal exhibiting the frequency of 4 MHz to produce a first delayed signal corresponding to said first frame pulse for generation of said redundancy synchronization signal.

13. The exchange system of claim 12, further comprised of said frame pulse selector comprising:

a first AND gate for logically combining an inverted first frame pulse and an inverted module activation signal;

a second AND gate for logically combining an inverted second frame pulse of the counterpart redundancy clock supply module and the module activation signal; and a NOR gate for logically combining the outputs of said first and second AND gates to produce said selected frame pulse.

14. The exchange system of claim 13, further comprised of said redundancy synchronization generator comprising:

a second delay flip-flop for delaying said selected frame pulse for a first period of the most significant clock signal exhibiting the highest frequency of 16 MHz to produce a second delayed signal;

a third delay flip-flop for delaying the second delayed signal for a second period of the most significant clock signal to produce a third delayed signal;

a fourth delay flip-flop for delaying the third delayed signal for a third period of the most significant clock signal to produce a fourth delayed signal; and a second NAND gate for logically combining the fourth delayed signal and an inverted third delayed signal to produce said redundancy synchronization signal serving as the initializing signal of the clock generator of the counterpart redundancy clock supply module.

15. The exchange system of claim 10, further comprised of said frame pulse generator comprising:

a first NAND gate for logically combining a first system clock signal exhibiting a frequency of 2 MHz and said frame period signal to generate a first logic signal; and a first delay flip-flop having a data terminal coupled to receive said first logic signal and a clock terminal coupled to receive a second system clock signal exhibiting a frequency of 4 MHz to produce a first delayed signal corresponding to said first fame pulse for generation of said redundancy synchronization signal.

16. The exchange system of claim 10, further comprised of said frame pulse selector comprising:

a first AND gate for logically combining an inverted first frame pulse and an inverted module activation signal;

a second AND gate for logically combining an inverted second frame pulse of the counterpart redundancy clock supply module and the module activation signal; and a NOR gate for logically combining the outputs of said first and second AND gates to produce said selected frame pulse.

17. The exchange system of claim 10, farther comprised of said redundancy synchronization generator comprising:

a first delay flip-flop for delaying said selected frame pulse for a first period of the most significant clock signal exhibiting the highest frequency of 16 MHz to produce a first delayed signal;

a second delay flip-flop for delaying the first delayed signal for a second period of the most significant clock signal to produce a second delayed signal;

a third delay flip-flop for delaying the second delayed signal for a third period of the most significant clock signal to produce a third delayed signal; and a NAND gate for logically combining the third delayed signal and an inverted second delayed signal to produce said redundancy synchronization signal serving as initializing signal of the clock generator of the counterpart redundancy clock supply module.

18. A process of maintaining clock synchronization in an exchange system having a plurality of redundancy modules, comprising the steps of:

phase-synchronizing a network synchronizing reference signal output from an external source and generating a most significant clock signal exhibiting a highest frequency of said network synchronizing reference signal;

counting the most significant clock signal and generating system clock signals exhibiting different frequencies extending from the most significant clock signal to a least significant clock signal exhibiting a lowest frequency and a frame pulse; and synchronizing said frame pulse and a frame pulse of a counterpart redundancy module to generate a redundancy synchronization signal for establishing clock synchronization between redundancy modules from the most significant clock signal to the least significant clock signal.

* * * * *